(12) United States Patent
Wu et al.

(10) Patent No.: US 8,435,652 B2
(45) Date of Patent: May 7, 2013

(54) MAGNETIC STACK STRUCTURE AND MANUFACTURING METHOD THEREOF

(75) Inventors: Te-Ho Wu, Yunlin (TW); Lin-Hsiu Ye, Yunlin (TW); Ching-Ming Lee, Yunlin (TW)

(73) Assignee: National Yunlin University of Science and Technology, Yunlin County (TW)

( * ) Notice: Subject to any disclaimer, the term of this patent is extended or adjusted under 35 U.S.C. 154(b) by 425 days.

(21) Appl. No.: 12/499,802

(22) Filed: Jul. 9, 2009

(65) Prior Publication Data

US 2010/0266873 A1    Oct. 21, 2010

(30) Foreign Application Priority Data

Apr. 16, 2009    (TW) ................................ 98112666 A

(51) Int. Cl.
*H01F 10/08*    (2006.01)
(52) U.S. Cl.
USPC ............ 428/811; 428/812; 365/158; 365/171; 365/172; 365/173

(58) Field of Classification Search ................ None
See application file for complete search history.

(56) References Cited

U.S. PATENT DOCUMENTS

| | | | |
|---|---|---|---|
| 6,767,655 B2 * | 7/2004 | Hiramoto et al. | 428/811.2 |
| 2005/0185455 A1 * | 8/2005 | Huai | 365/171 |
| 2005/0189574 A1 * | 9/2005 | Nguyen et al. | 257/295 |
| 2006/0255383 A1 * | 11/2006 | Kaiser et al. | 257/295 |
| 2007/0074317 A1 * | 3/2007 | Pakala et al. | 977/935 |
| 2007/0154740 A1 * | 7/2007 | Yuasa et al. | 428/812 |
| 2007/0215955 A1 * | 9/2007 | Wu et al. | 257/401 |
| 2008/0239591 A1 * | 10/2008 | Fuji et al. | 360/324.12 |

OTHER PUBLICATIONS

Nishimura, N., Hirai, T., Koganei, A., Ikeda, T., Okano, K., Sekiguchi, Y., and Osada, Y., J. App. Phys., 91(8), 5246-5249, 2002.*

* cited by examiner

*Primary Examiner* — Kevin Bernatz
(74) *Attorney, Agent, or Firm* — CKC & Partners Co., Ltd.

(57) ABSTRACT

A magnetic stack structure is disclosed. The magnetic stack structure includes two metal layers and a free layer sandwiched by the two metal layers. The thickness of the free layer is 1-30 nm. The thickness of the metal layers are 0.1-20 nm respectively.

3 Claims, 4 Drawing Sheets

MAGNETIC STACK STRUCTURE AND MANUFACTURING METHOD THEREOF

RELATED APPLICATIONS

The application claims priority to Taiwan Application Serial Number 98112666, filed Apr. 16, 2009, which is herein incorporated by reference.

BACKGROUND

1. Field of Invention

The present invention relates to an element for static information storage. More particularly, the present invention relates to magnetic storage elements.

2. Description of Related Art

Magnetic Random Access Memory (MRAM) is a nonvolatile memory. The magnetic structure of MRAM uses the reluctance variation to store data.

Since 1995, tunneling magneto resistance (TMR) is discovered. The structure of TMR is a free layer, a tunneling barrier, and a pinned layer arranged in sequentially. The tunneling barrier is an insulating layer. The free layer and the pinned layer are ferromagnetic layers. The direction of the magnetic moment of the pinned layer is fixed. The magnetic moment of the free layer can be altered by an external magnetic field. When the magnetic moment of the free layer is altered by an external magnetic field, the alignment of the magnetic moments of the free layer and the pinned layer can be parallel or anti-parallel. Therefore, the tunneling barrier can exhibit two different electrical resistances to respectively denote the data "0" and "1".

SUMMARY

According to one embodiment of the present invention, a magnetic stack structure is disclosed. The magnetic stack structure includes a free layer, a first metal layer and a second metal layer. The free layer is made of a rare earth-transition metal alloy. The thickness of the free layer is 1-30 nm. The first metal layer contacts one side of the free layer. The thickness of the first metal layer is 0.1-20 nm. The second metal layer contacts the other side of the free layer. The thickness of the second metal layer is 0.1-20 nm.

According to another embodiment of the present invention, a method of manufacturing a magnetic stack structure is disclosed. The method includes: A first metal layer is formed on a substrate, wherein the thickness of the first metal layer is 0.1-20 nm. A free layer is formed on the first metal layer, wherein the free layer is made of a rare earth-transition metal alloy and the thickness of the free layer is 1-30 nm. A second metal layer is formed on the free layer, wherein the thickness of the second metal layer is 0.1-20 nm.

According to another embodiment of the present invention, a magnetic tunneling stack structure is disclosed. The magnetic tunneling stack includes an electric conductive layer, a pinned layer, a butter metal layer, a tunneling barrier, a first metal layer, a free layer and a second metal layer. The electric conductive layer is on a substrate. The pinned layer is on the electric conductive metal layer. The pinned layer is made of a rare earth-transition metal alloy. The butter metal layer is on the pinned layer. The tunneling barrier is on the butter metal layer, wherein the tunneling barrier is insulated and nonmagnetic. The first metal layer is on the tunneling barrier, wherein the thickness of the first metal layer is 0.1-20 nm. The free layer is on the first metal layer. The free layer is made of a rare earth-transition metal alloy and the thickness of the free layer is 1-30 nm. The second metal layer is on the free layer, wherein the thickness of the second metal layer is 0.1-20 nm.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
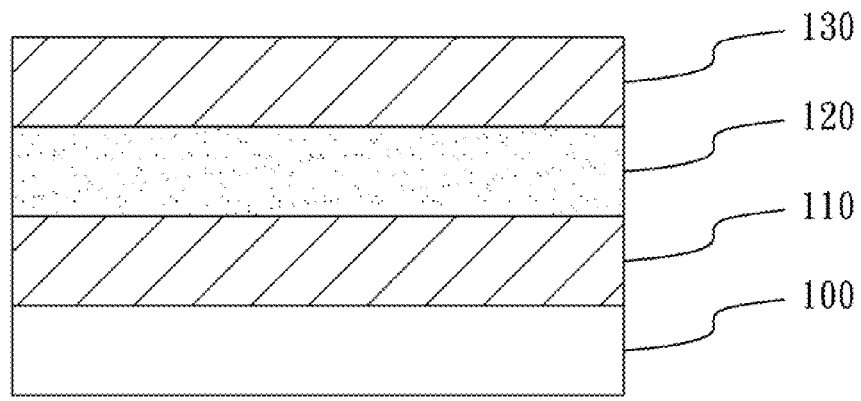
FIG. 1 is a cross-sectional view of a magnetic stack structure according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Generally speaking, the magnetic moment of the free layer can be altered by an external magnetic field. Thus, a good free layer requires a hysteresis loop with high squareness and low coercivity, then the magnetic moment of the free layer can be altered easily.

In general, the hysteresis loop is used to illustrate the characteristics of a magnetic material. The unit of the x-axes of the hysteresis loop is the Oe, which represents the external magnetic filed H. The unit of the y-axes of the hysteresis loop is the emu/c.c, which represents the magnetization M. When the external magnetic filed strength increased, the inducible magnetic moments of the magnetic material increased and reached to the saturation magnetization Ms. In other words, the saturation magnetization Ms represents the maximum inducible magnetic moments of the magnetic material. After the external magnetic filed H is removed, the remaining magnetization is called remanent magnetization Mr.

The squareness of a hysteresis loop is defined by the ratio of the remanent magnetization Mr over the saturation magnetization Ms (Mr/Ms) after removing the external magnetic field H. Therefore, if a magnetic material has a higher squareness, the magnetic material has a better ability to maintain the magnetic moment in a particular direction after removing the external field H. The coercivity of a magnetic material is defined by the required intensity of the external magnetic filed H to reduce the remanent magnetization Mr to zero.

Since the thickness of the free layer of conventional MRAM is larger than 30 nm, the coercivity is greater than 1 kOe. In other words, it requires a higher external magnetic field to alter the magnetic moment of the free layer. However, when the thickness of the free layer is reduced, the squareness is decreased thereby and thus decreases the reliability of the MRAM. Or even worse, the magnetic material can't even keep the magnetization after removing an external field. Therefore, providing a magnetic material and a magnetic structure for making the free layer of the MRAM to have high squareness and low coercivity is important.

FIG. 1 is a cross-sectional view of a magnetic stack structure according to one embodiment of the present invention. In FIG. 1, a magnetic-stack sequentially includes a substrate 100, a first metal layer 110, a free layer 120 and a second layer 130. The first metal layer 110, a free layer 120 and a second layer 130 are stacked on the substrate 100 to form a magnetic stack structure.

The substrate 100 is made of Si, for example. The first metal layer 110 and the second metal layer 130 are made of metal, such as Al, Mg, Ti, Ta, Pt or Pd, or alloys thereof or metallic compound, for example. The alloy is a metal that consists of two or more metals mixed together. The metallic compound is a substance containing atoms from two or more elements especially containing some metals. The thickness of the first metal layer 110 and the second metal layer 130 are 0.1-20 nm. The free layer 120 is made of rare earth-transition metal alloys, such as GdFeCo, TbFeCo or DyFeCo. The thickness of the free layer 120 is 1-30 nm.

Figure 2:
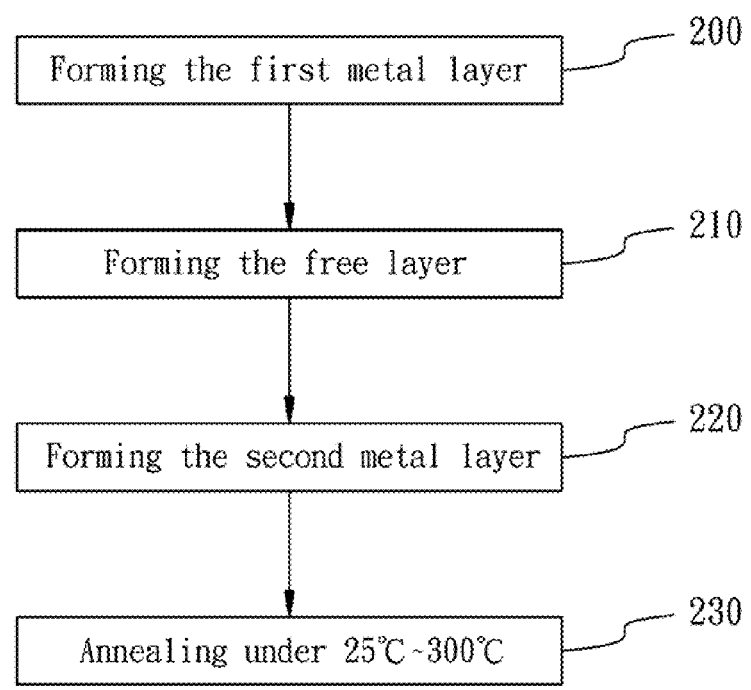
FIG. 2 is a flowchart of a method of manufacturing a magnetic stack structure according to another embodiment of this invention.

FIG. 2 is a flowchart of a method of manufacturing a magnetic stack structure according to another embodiment of this invention. In step 200, a first metal layer is formed on a substrate. In step 210, a magnetic layer is formed on the first metal layer. In step 220, a second metal layer is formed on the magnetic layer to form a magnetic stack structure including the first metal layer, the magnetic layer, and the second metal layer. In step 230, the temperature is raised to 25-300° C. to anneal the magnetic stacked structure. The first metal layer, the magnetic layer, and the second metal layer are made by sputtering, for example.

The Effect of Magnetic Structure on the Squareness of the Hysteresis Loop

Figure 3:
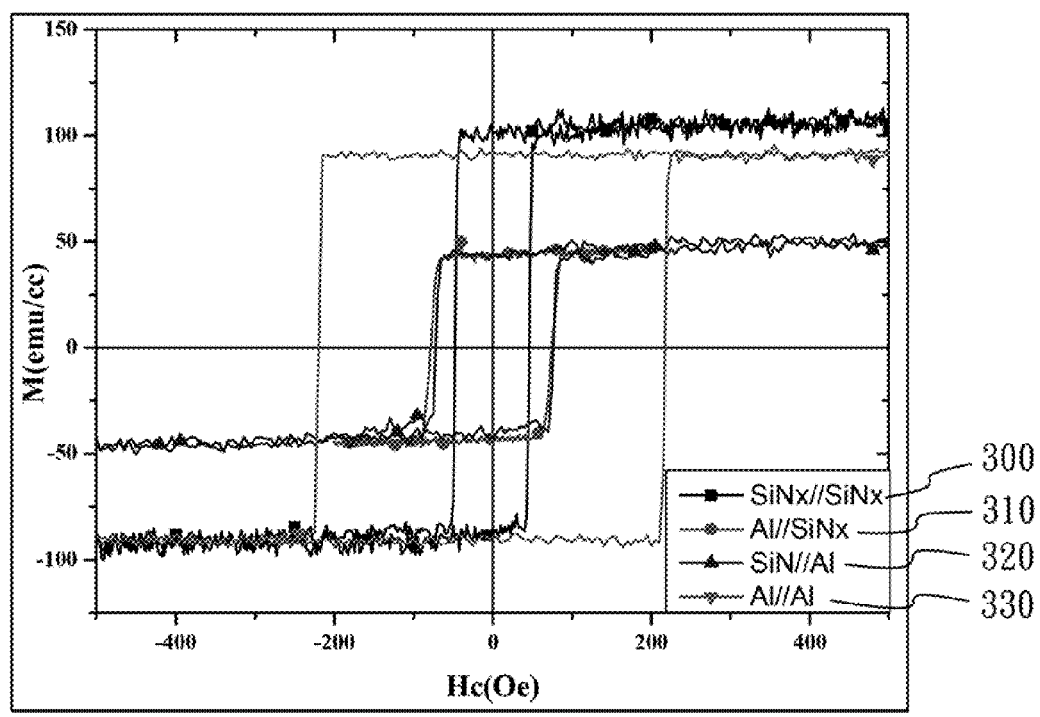
FIG. 3 illustrates the hysteresis loops of different magnetic stack structures.

FIG. 3 illustrates the hysteresis loops of different magnetic stack structures. The material of the magnetic stacked-layer and the squareness of the hysteresis loop thereof are shown in Table 1 as following.

TABLE 1

| | The first metal layer | The free layer | The second metal layer | Squareness (Mr/Ms) |
|---|---|---|---|---|
| Example 1 | Al | GdFeCo | Al | 0.99 |
| Comparison Example 1 | SiNx | GdFeCo | SiNx | 0.98 |
| Comparison Example 2 | SiNx | GdFeCo | Al | 0.86 |
| Comparison Example 3 | Al | GdFeCo | SiNx | 0.95 |

In FIG. 3 and Table 1, the hysteresis loop of Example 1 is shown as line 330, which is presented as a magnetic stack structure as in FIG. 1. The hysteresis loops of Comparison Example 1, 2 and 3 are shown as line 300, line 310 and line 320, respectively. In Example 1, the thickness of the first metal layer, the free layer and the second metal layer are 20 nm, 10 nm and 10 nm, respectively. In Table 1, Example 1 has the highest squareness. Therefore, the free layer has the better ability to maintain the magnetic moment in a particular direction after removing an external field when the free layer is sandwiched by two metal layers.

Effect of Annealing Temperature on Coercivity

Figure 4:
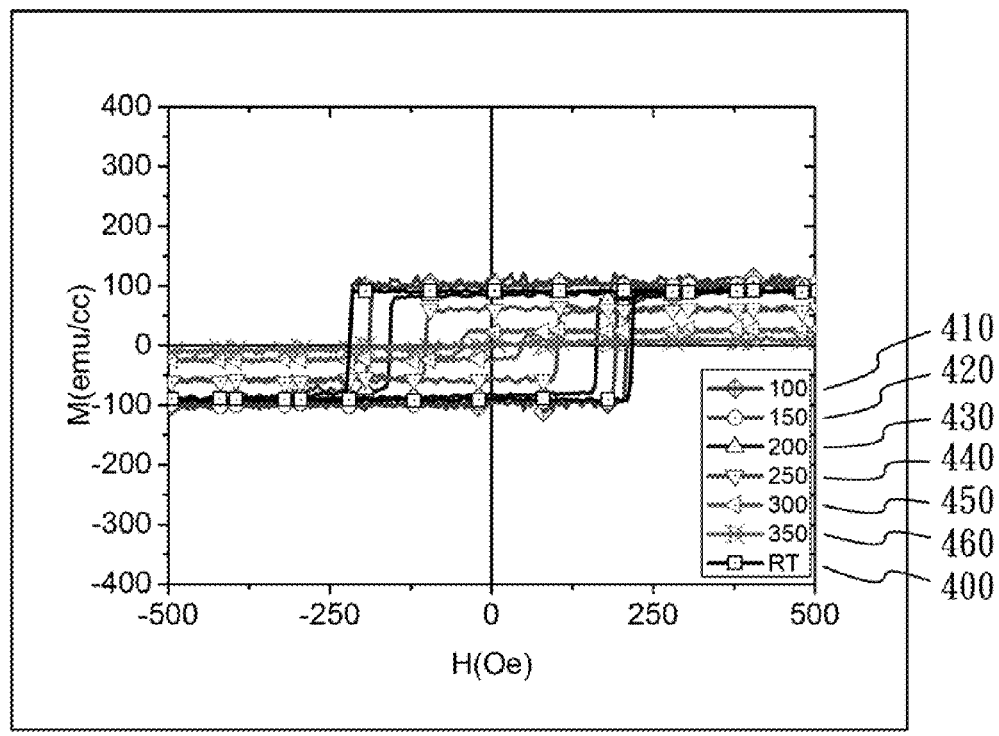
In FIG. 4 illustrates the hysteresis loops of the magnetic stack structure of FIG. 1 that is annealed under various temperatures.

FIG. 4 illustrates the hysteresis loops of the magnetic stack structure of FIG. 1 that is annealed under various temperatures. The material of the magnetic stack structure, the annealing temperature, and the coercivity are shown in Table 2. In FIG. 4 and Table 2, the material of the free layer is GdFeCo.

TABLE 2

| | The first metal layer | The free layer | The second metal layer | Annealing temperature | Coercivity |
|---|---|---|---|---|---|
| Example 1 | Al | GdFeCo | Al | | 191 Oe |
| Example 2 | Al | GdFeCo | Al | 100° C. | 191 Oe |
| Example 3 | Al | GdFeCo | Al | 150° C. | 143 Oe |
| Example 4 | Al | GdFeCo | Al | 200° C. | 131 Oe |
| Example 5 | Al | GdFeCo | Al | 250° C. | 77 Oe |
| Example 6 | Al | GdFeCo | Al | 300° C. | 28 Oe |
| Comparison Example 4 | Al | GdFeCo | Al | 350° C. | |

In FIG. 4 and Table 2, the hysteresis loop of Example 1 is shown as line 400, which is without annealing. The hysteresis loops of Examples 2-6 and Comparison Example 4 are shown as lines 410-460. The thickness of the first metal layer, the free layer and the second metal layer, in all examples and the comparison example 4, are 20 nm, 10 nm and 10 nm, respectively. Annealing changed the properties of the free layer, such as strength and hardness. Therefore, the higher temperature the magnetic stack structure is annealed, the lower coercivity it is. But, when the magnetic stack structure is annealed under 350° C., the hysteresis loops disappeared. Thus, the annealing temperature range is 150-300° C.

Figure 5:
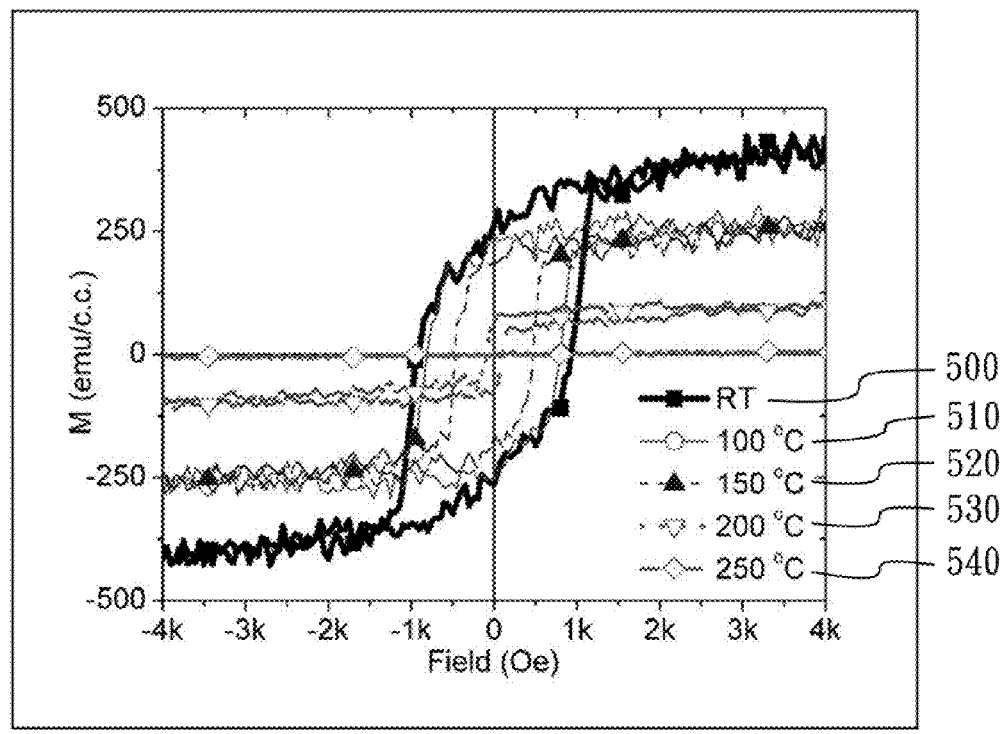
FIG. 5 illustrates the hysteresis loops of magnetic stack structure of FIG. 1 that is annealed under various temperatures.

FIG. 5 illustrates the hysteresis loops of magnetic stack structure of FIG. 1 that is annealed under various temperatures. The material of the magnetic stack structure, the annealing temperature, and the coercivity are shown in Table 3. In FIG. 5 and Table 3, the material of the free layer was changed to TbFeCo.

TABLE 3

| | The first metal layer | The free layer | The second metal layer | Annealing temperature | Coercivity |
|---|---|---|---|---|---|
| Example 7 | Al | TbFeCo | Al | | 1000 Oe |
| Example 8 | Al | TbFeCo | Al | 100° C. | 813 Oe |
| Example 9 | Al | TbFeCo | Al | 150° C. | 425 Oe |
| Example 10 | Al | TbFeCo | Al | 200° C. | 58 Oe |
| Comparison Example 5 | Al | TbFeCo | Al | 250° C. | |

In FIG. 5 and Table 3, the hysteresis loop of Example 7 is shown as line 500, which is without annealing. The hysteresis loops of Examples 8-10 and Comparison Example 5 are shown as lines 510-540. The thickness of the first metal layer, the free layer and the second metal layer, in all examples and the comparison example 5, are 10 nm, 3 nm and 10 nm, respectively. By comparing with the coercivity, the magnetic stack structure without annealing has the maximum coercivity. The coercivity is decreased by increasing the annealing temperature. However, when the magnetic stack structure is annealed under 250° C., the hysteresis loops disappeared. Thus, the annealing temperature range is 100-200° C.

Figure 6:
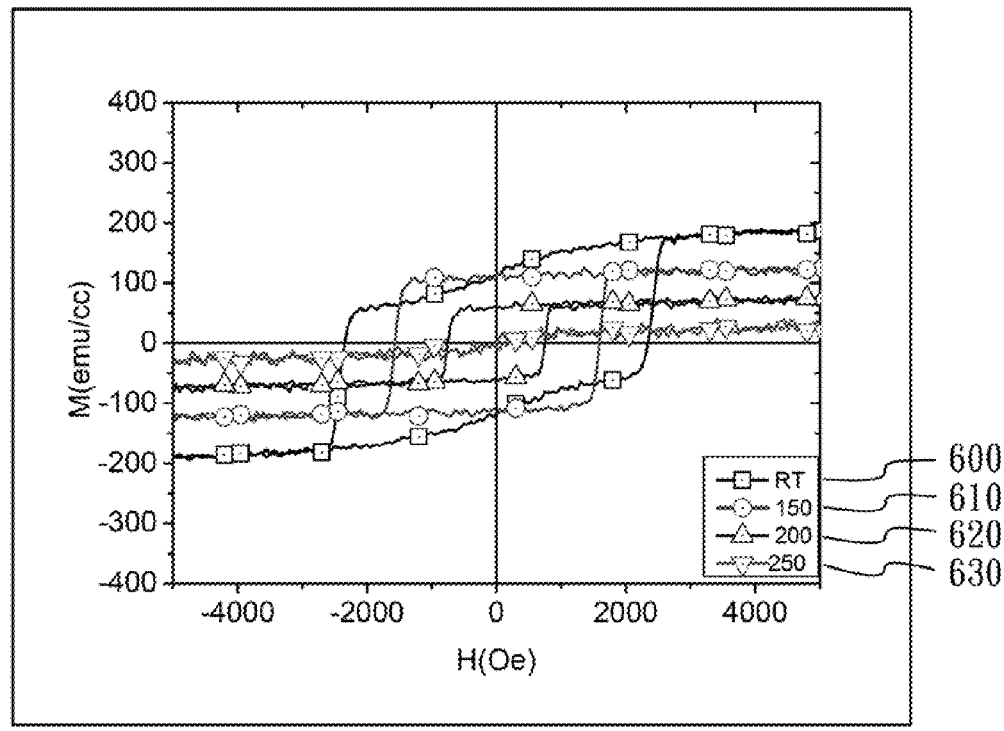
FIG. 6 illustrates the hysteresis loops of magnetic stack structure of FIG. 1 that is annealed under various temperatures.

FIG. 6 illustrates the hysteresis loops of magnetic stack structure of FIG. 1 that is annealed under various temperatures. The material of the magnetic stack structure, the annealing temperature, and the coercivity are shown in Table 4. In FIG. 6 and Table 4, the material of the free layer was changed to DyFeCo.

TABLE 4

| | The first metal layer | The free layer | The second metal layer | Annealing temperature | Coercivity |
|---|---|---|---|---|---|
| Example 11 | Al | DyFeCo | Al | | 2332 Oe |
| Example 12 | Al | DyFeCo | Al | 150° C. | 1602 Oe |
| Example 13 | Al | DyFeCo | Al | 200° C. | 744 Oe |
| Comparison Example 6 | Al | DyFeCo | Al | 250° C. | |

In FIG. 6 and Table 4, the hysteresis loop of Example 11 is shown as line 600, which is without annealing. The hysteresis loops of Examples 12-13 and Comparison Example 6 are shown as lines 610-630. The thickness of the first metal layer, the free layer and the second metal layer, in all examples and the comparison example 6, are 10 nm, 5 nm and 10 nm, respectively. The higher temperature the magnetic stack structure is annealed, the lower the coercivity is. Therefore, the magnetic moment of the free layer can be altered easily. However, when the magnetic stack structure is annealed under 250° C., the hysteresis loops disappeared. Thus, the annealing temperature range is 150-200° C.

Figure 7:
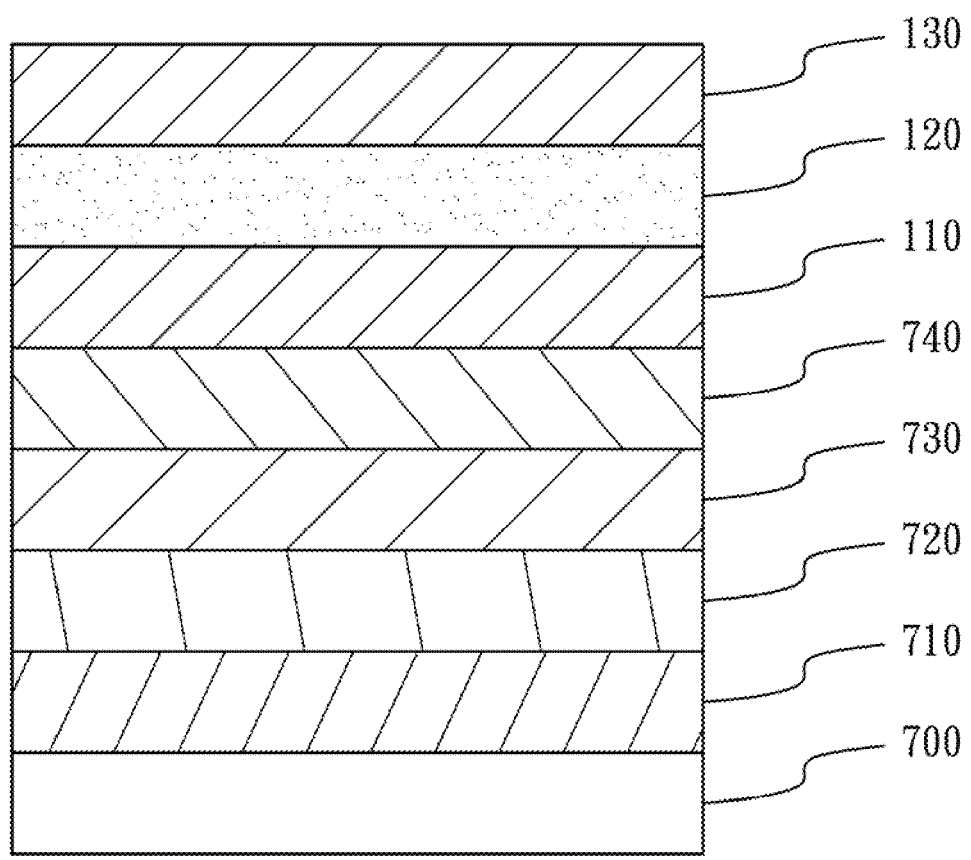
FIG. 7 is a cross-sectional view of a magnetic tunneling stack structure according to the other embodiment of the present invention.

FIG. 7 is a cross-sectional view of a magnetic tunneling stack structure according to another embodiment of the present invention. In FIG. 7, a magnetic tunneling stacked-structure includes a substrate 700, an electric conductive layer 710, a pinned layer 720, a buffer metal layer 730, a tunneling barrier layer 740, a first metal layer 110, a free layer 120 and a second metal 130 are stacked on the substrate 700 in order. The first metal layer 110, the free layer 120 and the second metal 130 are the magnetic stack structure in FIG. 1.

When the structure of FIG. 1 and the method of FIG. 2 are applied to the magnetic tunneling stack structure of FIG. 7, there are some advantages as following.

1. The squareness of the magnetic stack structure can be increased to maintain the magnetization (Mr) in a particular direction after removing an external field.

2. The coercivity of the magnetic tunneling stack structure can be decreased by annealing. Therefore, the magnetic moment can be easily altered by a lower external magnetic field to avoid altering the magnetization of other neighbor magnetic devices and decrease the power loss of he magnetic tunneling stack structure.

3. Annealing is used to rearrange the crystal structure of the magnetic stack structure. It can relieve the internal stresses of the crystal structure and the coercivity of the magnetic stack structure can be decreased. Therefore, the magnetic moment can be altered easily.

What is claimed is:

1. A magnetic stack structure for a MRAM application, the structure comprising:
   a free layer made of TbFeCo, the thickness of the free layer is 1-30 nm, and the free layer possesses a coercivity of 58 Oe-831 Oe;
   a first metal layer contacting one side of the free layer, and the thickness of the first metal layer is 0.1-20 nm, wherein the first metal layer is made of Al, Mg, Ti or alloys thereof or metallic compound thereof; and
   a second metal layer contacting the other side of the free layer, and the thickness of the second metal layer is 0.1-20 nm, wherein the second metal layer is made of Al, Mg or alloys thereof or metallic compound thereof.

2. A magnetic stack structure for a MRAM application, the structure comprising:
   a free layer made of GdFeCo, the thickness of the free layer is 1-30 nm, and the free layer possesses a coercivity of 28 Oe-143 Oe;
   a first metal layer contacting one side of the free layer, and the thickness of the first metal layer is 0.1-20 nm, wherein the first metal layer is made of Al, Mg, Ti or alloys thereof or metallic compound thereof; and
   a second metal layer contacting the other side of the free layer, and the thickness of the second metal layer is 0.1-20 nm, wherein the second metal layer is made of Al, Mg or alloys thereof or metallic compound thereof.

3. A magnetic stack structure for a MRAM application, the structure comprising:
   a free layer made of DyFeCo, the thickness of the free layer is 1-30 nm, and the free layer possesses a coercivity of 744 Oe;
   a first metal layer contacting one side of the free layer, and the thickness of the first metal layer is 0.1-20 nm, wherein the first metal layer is made of Al, Mg, Ti or alloys thereof or metallic compound thereof; and
   a second metal layer contacting the other side of the free layer, and the thickness of the second metal layer is 0.1-20 nm, wherein the second metal layer is made of Al, Mg or alloys thereof or metallic compound thereof.

* * * * *